(12) United States Patent
Hayashi et al.

(10) Patent No.: US 6,454,573 B2
(45) Date of Patent: Sep. 24, 2002

(54) BOARD-CABLE CONNECTION STRUCTURE

(75) Inventors: Hiroaki Hayashi; Takaya Nagahata; Hiroshi Fukumoto; Tokihiko Kishimoto, all of Kyoto; Koichi Wada, Yamagata, all of (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/823,760

(22) Filed: Apr. 3, 2001

(30) Foreign Application Priority Data

Apr. 4, 2000 (JP) ........................................ 2000-101684

(51) Int. Cl.[7] .............................................. H01R 12/00
(52) U.S. Cl. ........................................ 439/67; 439/492
(58) Field of Search ............................... 439/492, 493, 439/77, 495, 67, 329

(56) References Cited

U.S. PATENT DOCUMENTS 4,738,625 A    4/1988  Burton et al. .................. 439/59
4,824,391 A  * 4/1989  Li .................................. 439/329
5,277,621 A  * 1/1994  Seto .............................. 439/393

FOREIGN PATENT DOCUMENTS

WO         WO98/42044         9/1998  ............ H01R/9/09

* cited by examiner

Primary Examiner—Tulsidas Patel
(74) Attorney, Agent, or Firm—Michael D. Bednarek; Shaw Pittman LLP

(57) ABSTRACT

An electrical connection structure includes a circuit board provided at an edge thereof with a plurality of external connection terminals, a flexible flat cable provided at an edge thereof with a plurality of connection terminals in corresponding relationship to the external connection terminals of the circuit board, and a corresponding number of clips. Each of the clips has a first clamping portion open in a first direction for inserting the circuit board, and a second clamping portion open in a second direction opposite to the first direction for inserting the flexible flat cable.

8 Claims, 6 Drawing Sheets

BOARD-CABLE CONNECTION STRUCTURE

BACKGROUND OF THE INVENTION

1. Field of the Invention

The present invention relates to a structure for electrically connecting external connection terminals of a circuit board to connection terminals of a cable via clips.

2. Description of the Related Art

A typical prior art board-cable connection structure has such a structure as shown in FIG. 7. Specifically, FIG. 7 shows a thermal printhead 6 which includes a circuit board 7 made of a ceramic material for example. The circuit board 7 is formed with a heating resistor 70 extending longitudinally of the circuit board 7 at a portion adjacent one longitudinal edge thereof, and a plurality of external connection terminals 71 arranged at a predetermined pitch in a row extending along the other longitudinal edge of the circuit board 7 at a longitudinally central portion thereof. A plurality of drive ICs 72 are mounted on the circuit board 7 at a widthwise central portion of the circuit board 7 at a predetermined pitch in a row extending longitudinally of the circuit board 7. The circuit board 7 is further formed with a conductor pattern for electrically dividing the heating resistor 70 into a plurality of heating elements and for individually driving the heating elements for heat generation.

The thermal printhead 6 having the above-described structure is electrically connected via a connector 8 to a harness 9 for power supply and input/output of signals. The connector 8 comprises a socket 8A connected to the circuit board 7, and a plug 8B connected to the harness 9. The electrical connection of the circuit board 7 to the harness 9 is provided by inserting the plug 8B into the socket 8A. Specifically, the socket 8A includes a plurality of clips 80 held in a housing 81. Each of the clips 80 comprises a pin portion 80a and a clamping portion 80b. The clamping portion 80b clamps the circuit board 7 together with the external connection terminal 71, so that the circuit board 7 is electrically connected to the socket 8A. The plug 8B is formed with a plurality of holes 82 for receiving the pin portions 80a of the clips 80. When the plug 8B is inserted into the socket 8A, each of the pin portions 80a is held in the corresponding hole 82 so that the harness 9 and the circuit board 7 are electrically connected.

However, since the socket 8A, the housing 81, and the plug 8B are formed of a thermoplastic resin such as nylon for example, they are likely to be adversely affected by heat and are not thermally stable. Moreover, in addition to forming the clips 80, the housing 81 and the plug 8B need to be formed, which is troublesome and increases the cost.

SUMMARY OF THE INVENTION

It is therefore an object of the present invention to provide aboard-cable connection structure which is thermally stable and which can be manufactured economically and efficiently.

Another object of the present invention is to provide a connection clip which can be advantageously used for providing such a connection structure.

In accordance with a first aspect of the present invention, there is provided an electrical connection structure which comprises a circuit board provided at an edge thereof with a plurality of external connection terminals, a flexible flat cable provided at an edge thereof with a plurality of connection terminals in corresponding relationship to the external connection terminals of the circuit board, and a corresponding number of clips. Each of the clips includes a first clamping portion open in a first direction for inserting the circuit board, and a second clamping portion open in a second direction opposite to the first direction for inserting the flexible flat cable.

In this way; the connection structure of the present invention does riot use any additional component such as a connector housing which is made of a resin material. Thus, it is possible to provide the connection structure at a lower cost while also increasing the thermal stability of the connection structure in comparison with the prior art connection structure may be adversely affected by heat due to the presence of a resin material.

Preferably, wherein each of the clips may be integrally formed by bending a metal bar. In this case, the metal bar may be a part of a leadframe.

The clip can be manufactured using conventional equipment by a conventional method such as press-working for example. Therefore, the production of the clip according to the present invention does not cost higher than prior art clips.

In a preferred embodiment of the present invention, the first clamping portion includes a first clamp leg for contact with a respective one of the external connection terminals of the circuit board, whereas the second clamping portion includes a second clamp leg for contact with a respective one of the connection terminals of the flexible flat cable. Further, the first clamping portion and the second clamping portion includes a common clamp leg arranged between and cooperating with the first clamp leg and the second clamp leg. Moreover, the common clamp leg has a first end connected to the first clamp leg, whereas the common clamp leg also has a second opposite end connected to the second clamp leg.

Preferably, the first clamp leg may have a first contact portion bulging toward the common clamp leg which has a third contact portion bulging toward the first clamp leg, whereas the second clamp leg may have a second contact portion bulging toward the common clamp leg.

Preferably, the first contact portion of the first clamp leg may be spaced, thicknesswise of the circuit board, from the third contact portion of the common clamp leg by a distance which is smaller than the thickness of the circuit board when each clip is held in a natural state.

On the other hand, the second contact portion of the second clamp leg may contact the common clamp leg when each clip is held in a natural state.

According to a second aspect of the present invention, there is provided a connection clip for electrically connecting a circuit board to a flexible flat cable. The clip comprises a first clamping portion open in a first direction for inserting the circuit board, and a second clamping portion open in a second direction opposite to the first direction for inserting the flexible flat cable.

Other features and advantages of the present invention will become clearer from the detailed description given below with reference to the accompanying drawings.

DETAILED DESCRIPTION OF THE PREFERRED EMBODIMENTS

A preferred embodiment of the present invention will be described below in detail with reference to the accompanying drawings.

Figure 1:
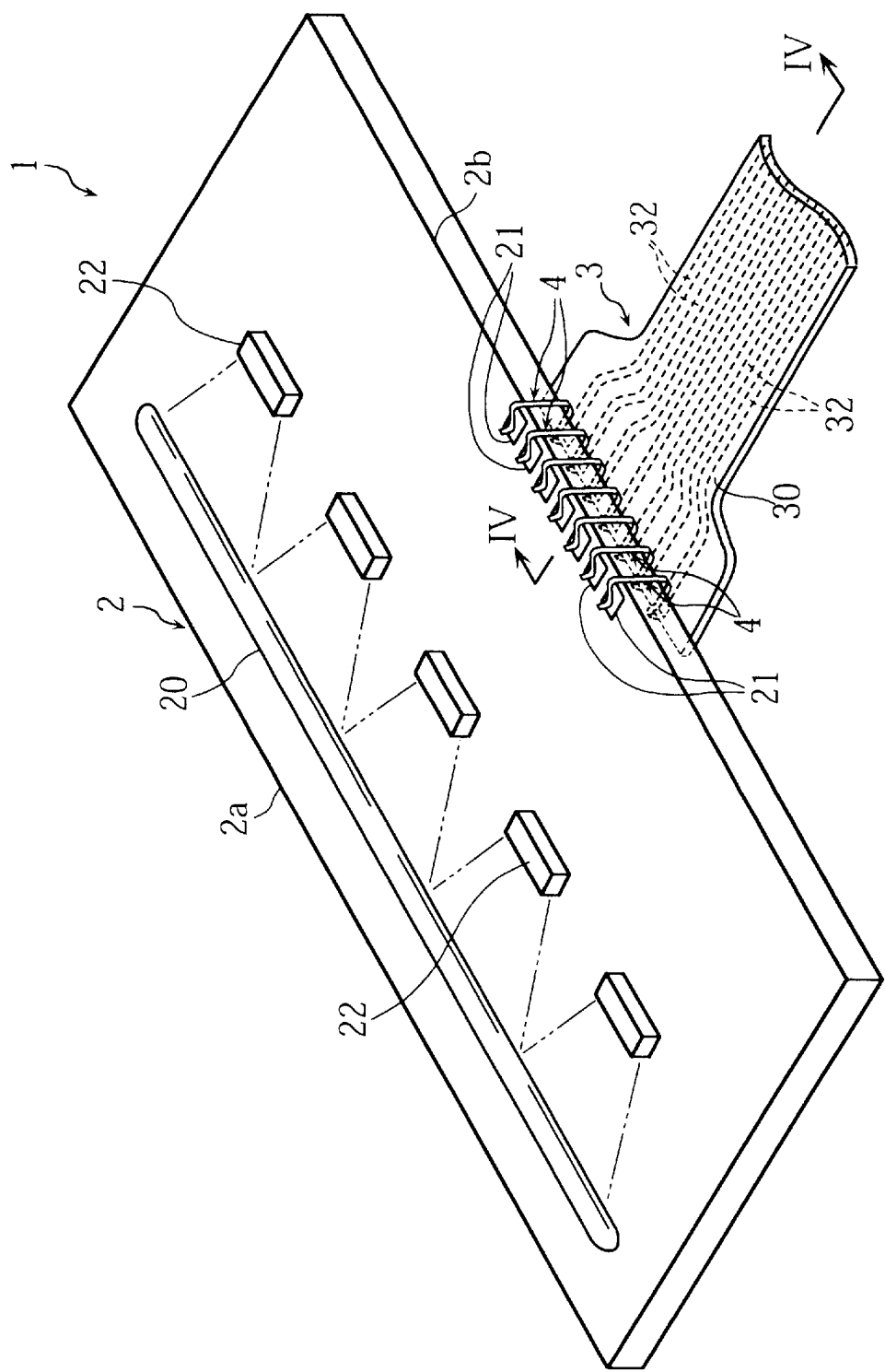
FIG. 1 is a perspective view showing a thermal printhead employing a board-cable connection structure in accordance with the present invention.
Figure 2:
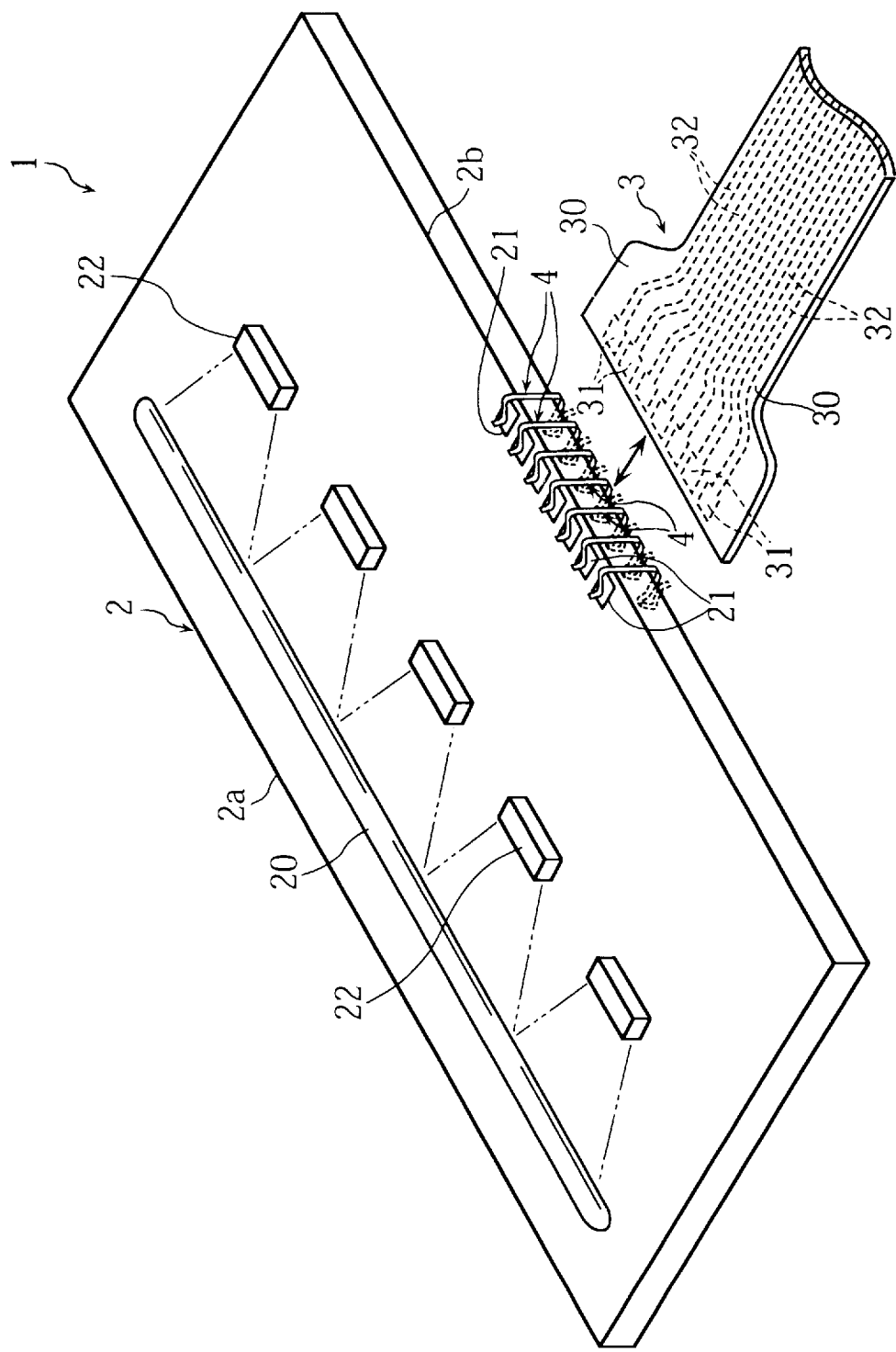
FIG. 2 is a perspective view showing the thermal printhead shown of FIG. 1 before inserting a flexible flat cable.

FIGS. 1 and 2 are perspective views showing a thermal printhead employing a board-cable connection structure in accordance with the present invention. As shown in FIGS. 1 and 2, the illustrated thermal printhead 1 has a circuit board 2 which is electrically connected, via a plurality of clips 4, to a flexible flat cable 3 (hereinafter abbreviated to FFC) which is removable.

The circuit board 2, which may be made of a ceramic material for example, has an elongated rectangular configuration. The circuit board 2 has an obverse surface formed with a heating resistor 20 extending longitudinally of the circuit board 2 at a portion adjacent one longitudinal edge 2a thereof. The obverse surface of the circuit board 2 is further formed with a plurality of external connection terminals 21 arranged at a predetermined pitch in a row extending along the other longitudinal edge 2b of the circuit board 2 at the longitudinally central portion thereof. A plurality of drive ICs 22 are mounted on the circuit board 2 at a widthwise central portion of the circuit board 2 at a predetermined pitch in a row extending longitudinally of the circuit board. Though not illustrated, the circuit board is formed with a conductor pattern for electrically connecting the heating resistor 30, the drive ICs 22 and the external connection terminals 21 to each other.

As clearly shown in FIG. 2, the FFC 3 comprises a flexible film band 30 formed of a highly heat-resistant material such as polyimide resin for example. The film 30 is formed with a plurality of connection terminals 31 arranged at a predetermined pitch in a row extending along the tip edge thereof, and a plurality of wirings 32 respectively connected to the connection terminals 31. The connection terminals 31 are so provided as to correspond, in number, size and position, to the external connection terminals 21 of the circuit board 2. The connection terminals 31 and the wirings 32 may be formed by forming a conductor layer made of copper for example on a surface of the film 30 and then appropriately etching the conductor layer.

Figure 3:
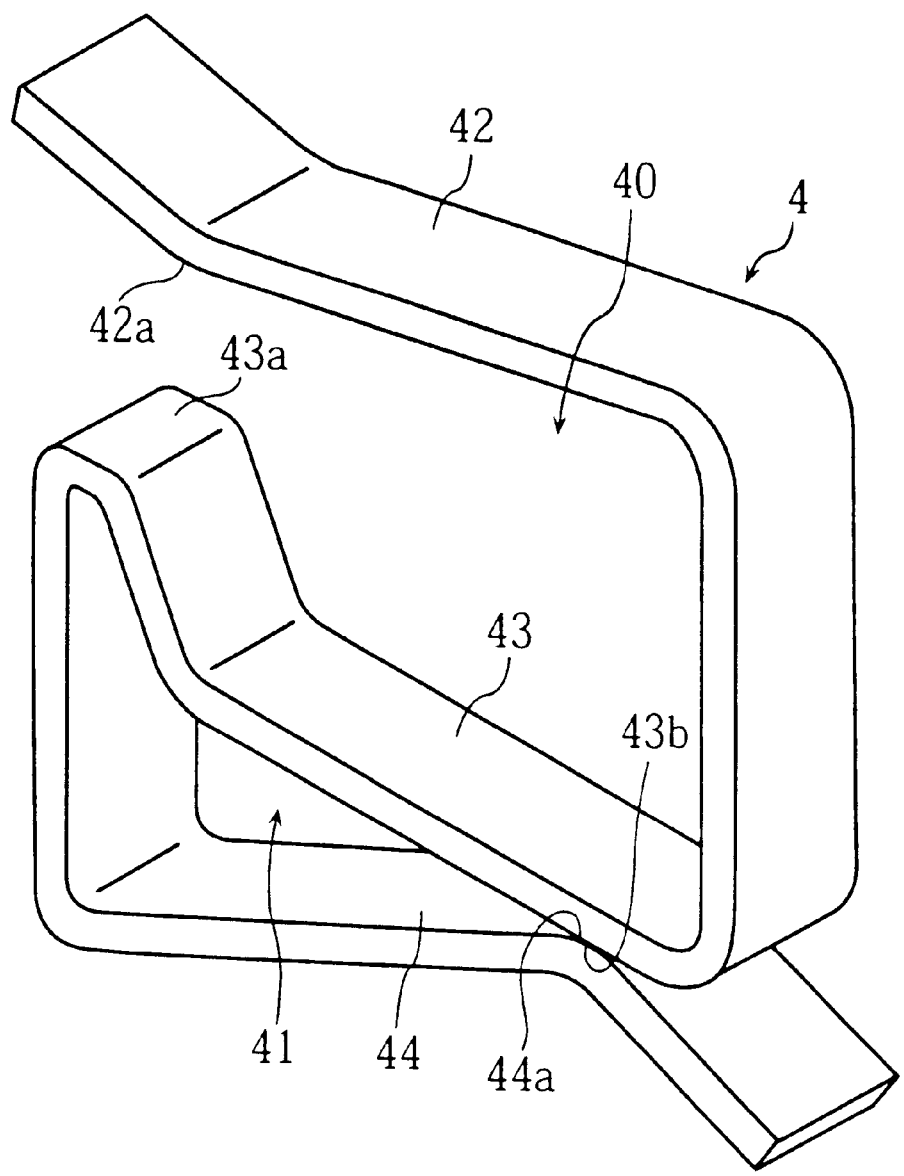
FIG. 3 is a perspective view of a clip which forms part of the connection structure shown in FIG. 1.

As shown in FIG. 3, each of the clips 4 include a first clamping portion 40 and a second clamping portion 41 integral with the first clamping portion 40. The clip 4 having the above configuration may be formed by bending a metal bar by press-working for example.

Figure 4:
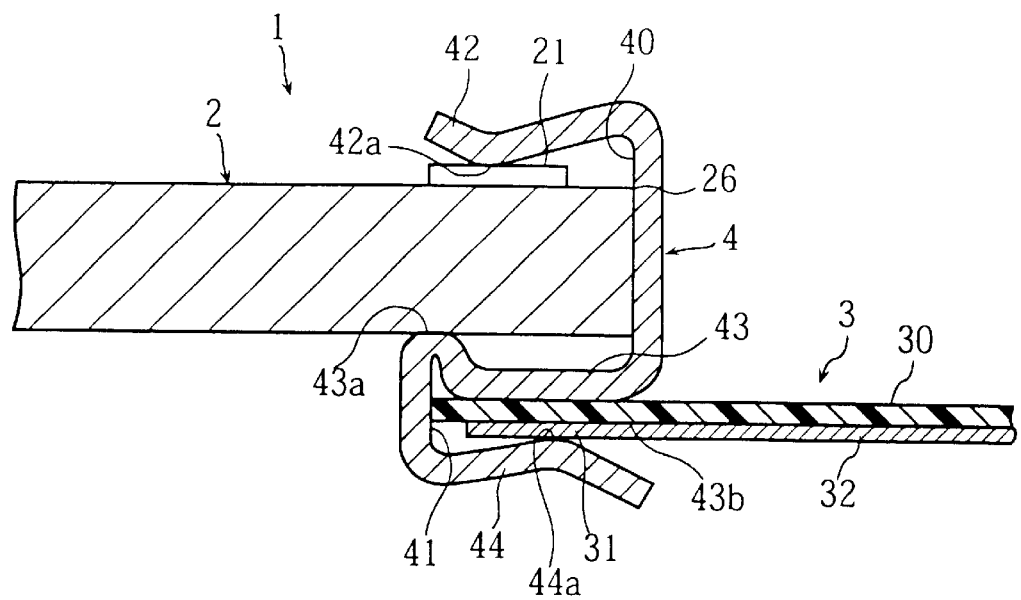
FIG. 4 is a sectional view taken along lines IV—IV in FIG. 1.
Figure 5:
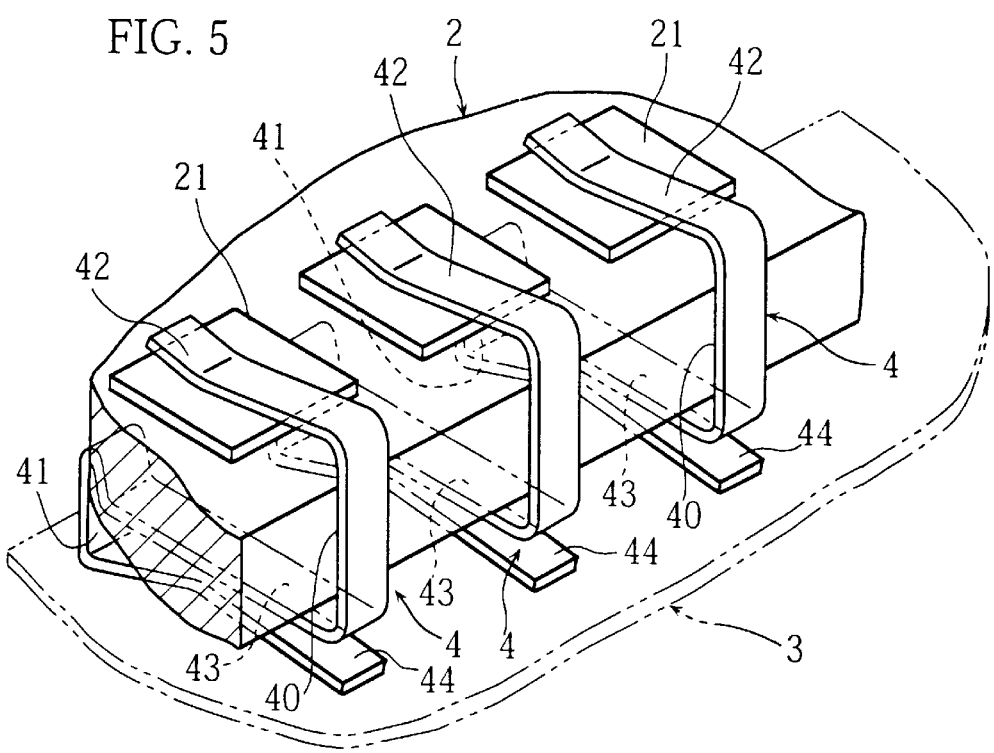
FIG. 5 is an enlarged perspective view showing a principal portion of the connection structure.

As clearly shown in FIG. 4, the first clamping portion 40, which is open in a first direction, functions to clamp the circuit board 2. The first clamping portion 40 comprises a common segment 43, and a first clamp leg 42 continuous with the common segment 43. The first clamp leg 42 and the common segment 43 have respective contact portions 42a, 43a for contact with the circuit board 2 in clamping the circuit board 2, as shown in FIGS. 4 and 5. In a natural state, the distance between the two contact portions 42a, 43a is smaller than the thickness of the circuit board 2. By forcing the circuit board 2 between the contact portions 42a and 43a so as to enlarge the distance therebetween, the circuit board 2 is elastically clamped by the first clamping portion 40.

As shown in FIG. 4, the second clamping portion 41, which is open in a second direction opposite to the first direction, functions to clamp the FFC 3. In addition to the common segment 43, the second clamping portion 41 comprises a second clamp leg 44 continuous with the common segment 43. As clearly shown in FIG. 3, the second clamp leg 44 has a contact portion 4a formed by bending the second clamp leg 44 vertically inwardly. The contact portion 4a comes into contact with a counterpart contact portion 43b of the common segment 43 in its natural state. The FFC 3 is inserted and elastically clamped between the contact portion 43b and the contact portion 4a.

Each of the first and the second clamping portions 40, 41 including the respective contact portions 42a, 43a, 43b, 4a may be formed with a guiding recess or projection. For example, a groove extending in the inserting direction of the circuit board 2 or the FFC 3 may be provided to reduce the contacting area between the clip 4 and the circuit board 2 or the FFC 3, thereby reducing the resistance during the insertion. A plurality of such recesses or projections may be formed in a row extending widthwise of the clip 4.

The above-described clip 4 may be used in the following manner to establish electrical connection between the circuit board and the FFC.

First, as shown in FIG. 5, the first clamping portion 40 of each clip 4 is fitted over the circuit board 2 with the contact portion 42a brought into contact with a corresponding external connection terminal 21 of the circuit board 2. Thus, the circuit board 2 is electrically connected to the clip 4. Since the distance between the contact portion 42a and the contact portion 43a of the first clamping portion 40 is smaller, in its natural state, than the thickness of the circuit board 2, the circuit board 2 is appropriately held by the clip 4 under the elastic restoring force of the first clamping portion 40. If the elastic restoring force of the first clamping portion 40 is insufficient, the first clamping portions 40 and the corresponding external connection terminal 21 may be bonded by soldering, thereby more reliably holding the clip 4 on the circuit board 2.

Figure 6:
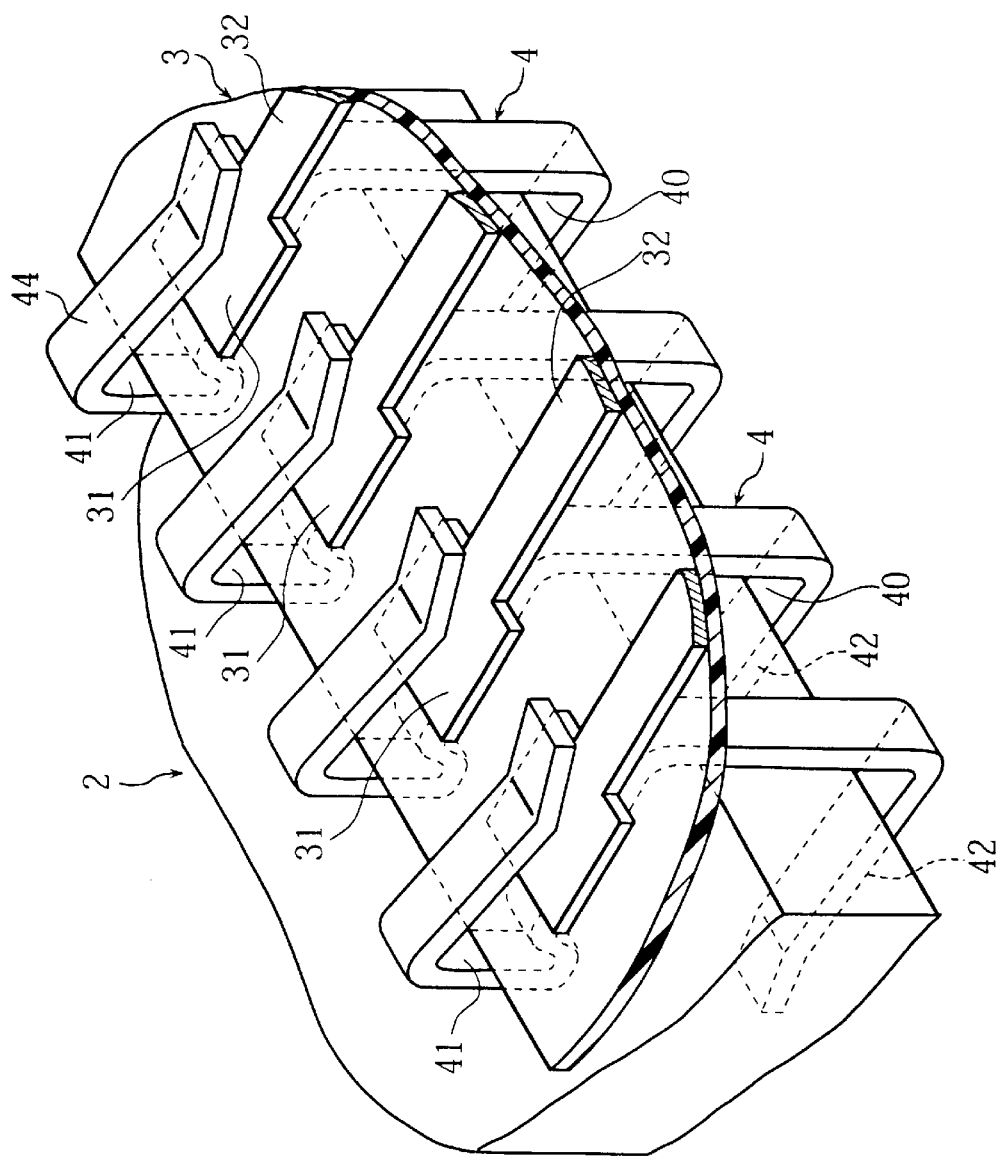
FIG. 6 is an enlarged perspective view showing a principal portion of the connection structure as seen upside down.
Figure 7:
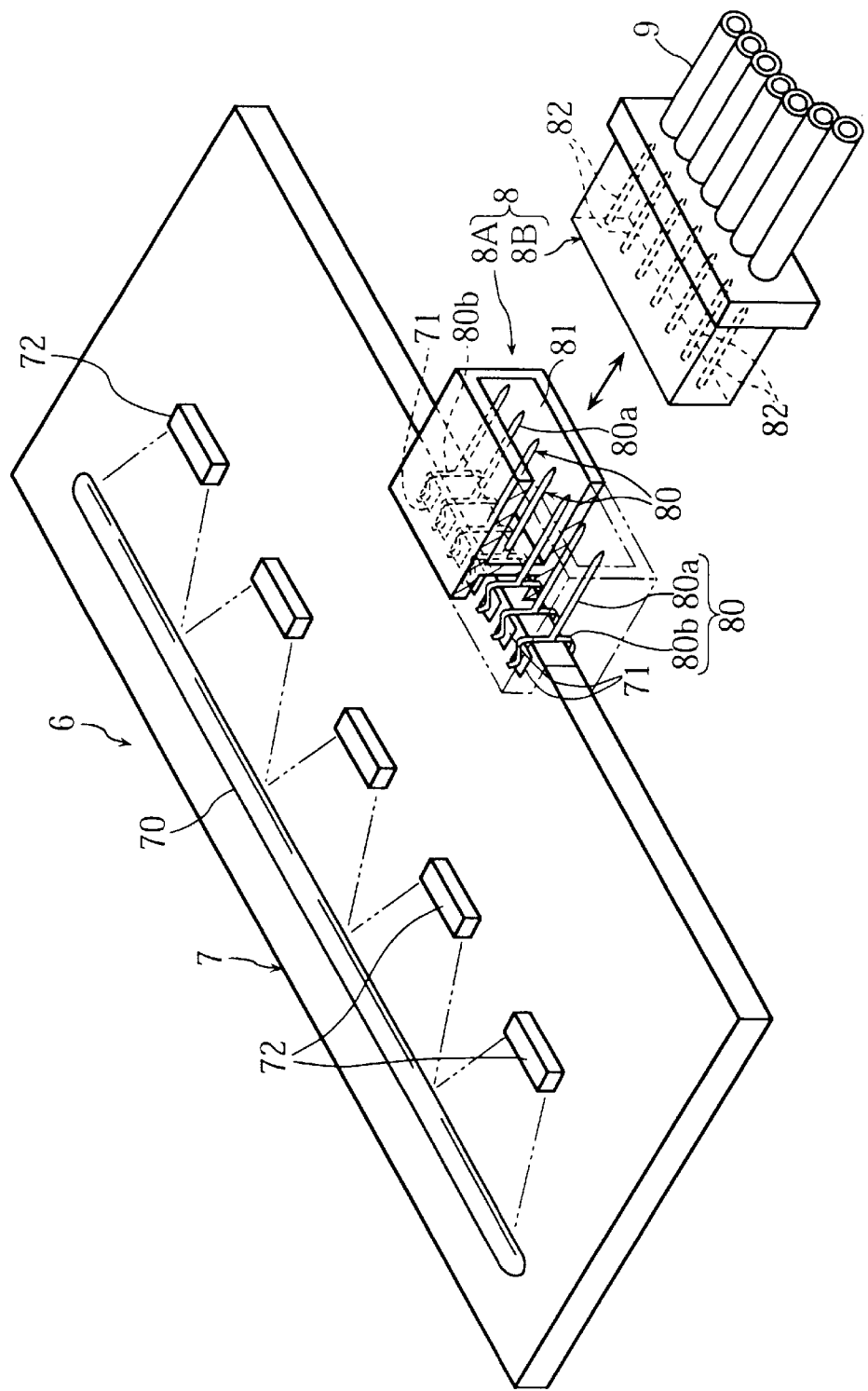
FIG. 7 is a perspective view showing a thermal printhead employing a prior-art board-cable connection structure.

Next, as shown in FIGS. 2, 4 and 6, the FFC 3 is inserted into the second clamping portion 41 of each clip 4 with the wirings 32 oriented downward. As described above, the connection terminals 31 of the FFC 3 are so provided as to correspond, in size and position, to the external connection terminals 21 of the circuit board 2. Therefore, by appropriately positioning the FFC 3 upon inserting into the second clamping portion 41, each of the connection terminals 31 (and the wirings 32 as well) of the FFC 3 is electrically connected to a corresponding one of the external connection terminals 21 of the circuit board 2 via the clip 4.

With the above-described connection structure, it is possible to electrically connect the circuit board 2 and the FFC 3 using the clips 4 only. Therefore, it is not necessary to provide additional parts such as a connector housing for example, thereby reducing the cost while eliminating the need for making such additional parts. Thus, the above-described connection structure is advantageous in view of economy and production efficiency. Moreover, the connection structure is thermally more stable than the structure which employs a resin part.

What is claimed is:

1. A caseless electrical connection structure comprising:

a circuit board provided at an edge thereof with a plurality of external connection terminals;

a flexible flat cable provided at an edge thereof with a plurality of connection terminals in corresponding relationship to the external connection terminals of the circuit board; and a corresponding number of clips each of which includes a first clamping portion open in a first direction for inserting the circuit board, and a second clamping portion open in a second direction opposite to the first direction for inserting the flexible flat cable;

wherein the first clamping portion includes a first clamp leg for contact with a respective one of the external connection terminals of the circuit board, the second clamping portion including a second clamp leg for contact with a respective one of the connection terminals of the flexible flat cable, the first clamping portion and the second clamping portion including a common clamp leg arranged between and cooperating with the first clamp leg and the second clamp leg, the common clamp leg having a first end connected to the first clamp leg, the common clamp leg also having a second opposite end connected to the second clamp leg, the common clamp leg directly contacting the circuit board and the flexible flat cable.

2. The electrical connection structure according to claim 1, wherein each of the clips is integrally formed by bending a metal bar.

3. The electrical connection structure according to claim 1, wherein the first clamp leg has a first contact portion bulging toward the common clamp leg, the second clamp leg has a second contact portion bulging toward the common clamp leg, the common clamp leg having a third contact portion bulging toward the first clamp leg.

4. The electrical connection structure according to claim 3, wherein the first contact portion of the first clamp leg is spaced, thicknesswise of the circuit board, from the third contact portion of the common clamp leg by a distance which is smaller than the thickness of the circuit board when each clip is held in a natural state.

5. The electrical connection structure according to claim 3, wherein the second contact portion of the second clamp leg contacts the common clamp leg when each clip is held in a natural state.

6. A connection clip for electrically connecting a circuit board to a flexible flat cable in a caseless manner, the clip comprising:

a first clamping portion open in a first direction for inserting the circuit board; and a second clamping portion open in a second direction opposite to the first direction for inserting the flexible flat cable;

wherein the first clamp leg has a first contact portion bulging toward the common clamp leg, the second clamp leg has a second contact portion bulging toward the common clamp leg, the common clamp leg having a third contact portion bulging toward the first clamp leg; and wherein the second contact portion of the second clamp leg contacts the common clamp leg in a natural state of the clip.

7. The clip according to claim 6, wherein the first and second clamping portions are integrally formed by bending a metal bar.

8. The clip according to claim 6, wherein the first contact portion of the first clamp leg is spaced, thicknesswise of the circuit board, from the third contact portion of the common clamp leg by a distance which is smaller than the thickness of the circuit board when the clip is held in a natural state.

* * * * *